United States Patent [19]
Lee et al.

[11] Patent Number: 5,909,405
[45] Date of Patent: *Jun. 1, 1999

[54] NONVOLATILE SEMICONDUCTOR MEMORY

[75] Inventors: Hyong-gon Lee, Kyungki-do; Heung-soo Im, Seoul; Kang-deog Suh, Kyungki-do, all of Rep. of Korea

[73] Assignee: Samsung Electronics Co., Ltd., Kyungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/774,646

[22] Filed: Dec. 30, 1996

[30] Foreign Application Priority Data

Dec. 30, 1995 [KR] Rep. of Korea ................. 95-67815

[51] Int. Cl.$^6$ ........................................................ G11C 7/00
[52] U.S. Cl. ....................... 365/230.03; 365/63; 365/103
[58] Field of Search ..................... 365/63, 230.03, 365/94, 103, 104, 51, 207

[56] References Cited

U.S. PATENT DOCUMENTS

| | | | |
|---|---|---|---|
| 5,280,442 | 1/1994 | Hotta et al. | 365/103 X |
| 5,726,929 | 3/1998 | Suminaga et al. | 365/230.03 X |
| 5,764,575 | 6/1998 | Kawai et al. | 365/230.03 X |

*Primary Examiner*—Do Hyun Yoo
*Attorney, Agent, or Firm*—Pillsbury Madison & Sutro LLP

[57] ABSTRACT

A semiconductor memory includes a plurality of main bit lines led to sense amplifiers and arranged in a row, direction, a first group of sub bit lines interposed between the memory banks and connected to the main bit lines through a first group of selection transistors, and a second group of sub bit lines interposed between the memory banks and the first group of sub bit lines and connected to a common ground line through a second group of selection transistors.

5 Claims, 7 Drawing Sheets

NONVOLATILE SEMICONDUCTOR MEMORY

BACKGROUND OF THE INVENTION

1. Field of the Invention

The invention relates in general to nonvolatile semiconductor memory devices and more particularly to a memory employing flat-type memory cells.

2. Description of the Prior Art

Read only memories, generally referred to as nonvolatile memories, typically have memory cell arrangements which are classified as NOR-typed or NAND-typed cell arrays in accordance with logic circuit definitions. The NOR-typed cell array has the advantage of obtaining efficient current drive capability, but it causes a shortage of space by its cell size. The advantage and disadvantages are reversed in the NAND-typed cell array. Due to the relative strength and weakness of the two cell array types, a flat-type cell array has been proposed as a successful solution for the read only memories. The flat-type cell array is, in digital logic standard, a kind of NOR-typed arrangement.

Nonvolatile memories having the flat-type memory cell array have been disclosed in several articles, e.g., "12-Mb ROM Design Using Bank Select Architecture" (88 SYMPOSIUM ON VLSI CIRCUITS, VI-7, pp.85–86). The architecture of the memory cell array of the preceding article is shown in FIG. 1, wherein memory cell blocks are selected by activating selection signals SOm (for odd columns) and SEm (for even columns) where SOm−1 and SEm+1 conduct for adjacent memory blocks. Bit lines are classified into main bit line MBi−1 to MBi+2 and sub bit lines SB2i−3 to SB2i+4. Every two sub bit lines are subjected to one main bit line, and main bit lines MBi−1 and MBi+1 act as virtual ground lines.

During a read operation, in order to select a memory cell, for example, RC13, power supply voltage Vcc is applied to word line WL1 and ground voltage Vss is applied to other word lines WL2 to WLn. Main bit line MBi−1 is connected to Vss while main bit line MBi is being activated. The discharging current at the forced condition flows starting from main bit line MBi, and then through odd column selection transistor T05, sub bit line SB2i−1, memory cell RC14, even column selection transistor TE5, main bit line MBi−1, column gate transistor TY1, ground selection transistor TG1 and Vss, and in that order. Sense amplifier, connected to MBi through column gate transistor TY2, generates a data bit "1" or "0" from detecting a voltage level on MBi which is determined by a threshold voltage of selected memory cell RC13.

Assuming that when a read operation is conducted for memory cell RCn2 with a threshold voltage VT ranged from 0V to Vcc (0<VT<Vcc; hereinafter, such a memory cell may be called "on-cell"), MBi is pulled down and then sense amplifier SAx reads "0". The discharging current at this time flows, as shown with the broken line in FIG. 1, starting from main bit line MBi, odd column selection transistor T05, sub bit line SB2i−1, memory cell RCn2, odd column selection transistor T03, main bit line MBi−1, column gate transistor TY1, ground selection transistor TG1 and Vss, in that order.

Since sources and drains of the adjacent memory cells are connected to diffusion regions which are formed in a semiconductor bulk (or substrate), a voltage drop, caused by conductive on-cells, is substantially made up throughout the resistance in diffusion regions by which the sub bit line is constructed. Thus, the amount of the current flowing through the on-cell (e.g., RCn2) is delimited by the diffusion resistance involved in the source and drain regions as well as the sub bit lines. A more detailed description of the current where a piece of information is read out from memory cell RCn2 is provided with reference to FIG. 2. In this case, as shown in FIG. 2, the aforementioned current meets resistance r2 of a partial diffusion region which connects odd column selection transistor T05 to memory cell RCn2 and resistance r1 of a partial diffusion region which connects memory cell RCn2 to odd column selection transistor T03.

While, assuming that when another read operation is being conducted for memory cell RC12 with a threshold voltage larger than Vcc (VT>Vcc; hereinafter, such a memory cell may be called as "off-cell"), main bit line MBi must be pulled up to a high level of voltage and thereby sense amplifier SAx must detect "1" from the main bit line MBi. But, if other memory cells RC13 to RC17 connected to word line WL1 which activates the memory cell RC12 are held up in an on-cell, the current from sense amplifier SAx flows into adjacent main bit lines (e.g., MBi+1, MBi+2, ...) through the adjacent memory cells connected to W11 and odd column selection transistors responding to odd column selection signal SOm, while there is no current path towards the main bit line MBi−1 due to the nonconductive memory cell RC12. The unwanted current entrance into the adjacent bit lines makes it difficult for the main bit line MBi to retain the high level, so that a read-out time for data bit "1" becomes longer in proportion to the current amount induced thereby.

The current degradation due to the parasitic resistances of the diffusion regions has been considered in U.S. Pat. No. 5,280,442 (hereinafter the '442 patent) which powers the degradation rate of sensing current. FIG. 3 illustrates the architecture of memory cell array disclosed in the '442 patent, using the same dimensions of FIG. 1. In FIG. 3, memory blocks are arranged in the row direction, each memory block being numbered with odd and even numbers therein, and sub bit lines SB2i−3 to SB2i+4 are interposed between the memory blocks. Each sub bit line is connected in common to memory cells of adjacent memory blocks, and main bit lines MBi−1 to MBi+2, arranged in parallel with the sub bit lines, are positioned in columns by groups of two. One main bit line is connected to the three sub bit lines, such that main bit line Mbi−1 is connected to SB2i−3 through odd column selection transistor TOi−1 at node NOi−1, to SB2i−1 through TEi at node NEi−1 and directly to SB2i−2. When memory cell RCn2 of FIG. 3 is selected, the current path is formed, as shown in FIG. 3, through main bit line MBi, odd column selection transistor TOi, sub bit line SB2i−1, memory cell RCn2, main bit line MBi−1 and Vss, and in this order.

FIG. 4 shows a more advanced configuration which provides a better current drivability compared to the configuration shown in FIG. 2, in which the sensing current flows through two transistors and parasitic resistances. However, the circuit architecture as shown in FIG. 3 has at least a bit line capacitance value of at least four times that of the bit line capacitance value in FIG. 1, at a node (e.g., NOi) at which the main bit line and sub bit line are coupled to each other (note that main bit line of FIG. 1 is just connected to source and drain diffusion regions between cell transistors). A main bit line is connected to a sub bit line coupled to source and drain diffusion regions between adjacent cell transistors, and further to such two sub bit lines. Therefore, assuming that memory cell RC12 is selected and is on off-cell, when main bit line MBi goes to a high level and thereafter the data bit is read out as "1" from a sense amplifier corresponding to the main bit line MBi, the increased capacitance engaged in the main bit line causes the read-out time for "1" to be longer than that of the arrangement shown in FIG. 1.

Even in the architecture shown in FIG. 3, as the architecture shown in FIG. 1, unwanted leak current may flow toward a non selected adjacent main bit line through memory cell transistors and odd column selection transistors during a read operation for an on-cell.

With the circuit arrangements of the cell arrays depicted either in FIG. 1 or in FIG. 3, the enhancement the read-out speed for data (particularly for "1") stored in memory cells is still under development for the numerous reasons mentioned heretofore, and the above mentioned problems are also applicable to high density and fast nonvolatile memories.

SUMMARY OF THE INVENTION

It is therefore an object of the invention to provide a nonvolatile semiconductor memory with a fast read operation.

It is another object of the invention to provide a nonvolatile semiconductor memory suitable for high density and capable of performing a fast read operation.

It is a further object of the invention to provide a nonvolatile semiconductor memory employing a cell array in which data can be efficiently read out from cells without a reduced bit line capacitance.

A first preferred embodiment illustrates a semiconductor memory including a plurality of main bit lines led to sense amplifiers and arranged in a row direction, a first group of sub bit lines interposed between the memory banks and connected to the main bit lines through a first group of selection transistors, a second group of sub bit lines interposed between the memory banks and the first group of sub bit lines and connected to a common ground line through a second group of selection transistors.

A second preferred embodiment shows a semiconductor memory including a plurality of main bit lines led to sense amplifiers and arranged in a row direction, a plurality of sub bit lines interposed between the memory banks and connected to the main bit lines respectively through a first group of selection transistors and a second group of selection transistors, means for connecting a first group of the main bit lines to sense amplifiers and connecting other main bit lines adjacent to the first group of the main bit lines to a ground voltage.

A third preferred embodiment discloses a semiconductor memory including a first group of main bit lines arranged in a row direction and connected to a ground voltage, a second group of main bit lines arranged in the row direction and connected to sense amplifiers, a first group of sub bit lines interposed between the memory banks and connected to the first and second groups of main bit lines respectively through a first group of selection transistors and a second group of selection transistors, a second group of sub bit lines interposed between the memory banks and the first group of sub bit lines, a first group of bank selection transistors whose gates are coupled to a first selection signal in common and whose channel paths are interposed between said first and second groups of sub bit lines, and a second group of bank selection transistors whose gates are coupled to a second selection signal in common and whose channel paths are interposed between the first and second groups of sub bit lines.

DETAILED DESCRIPTION OF THE PREFERRED EMBODIMENTS

Figure 1:
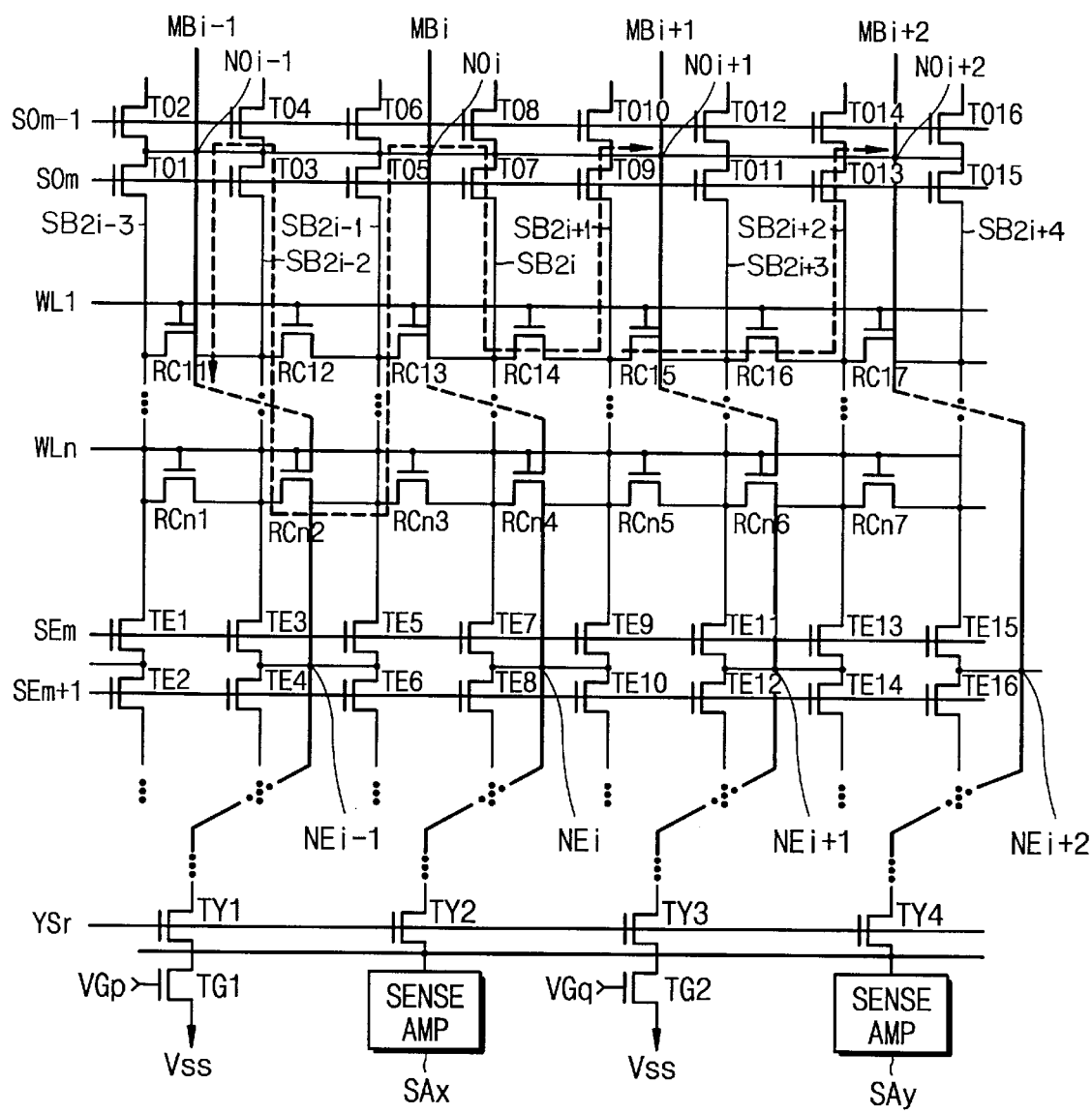
FIG. 1 is a circuit diagram illustrating a conventional architecture of a memory cell array of a nonvolatile memory.
Figure 2:
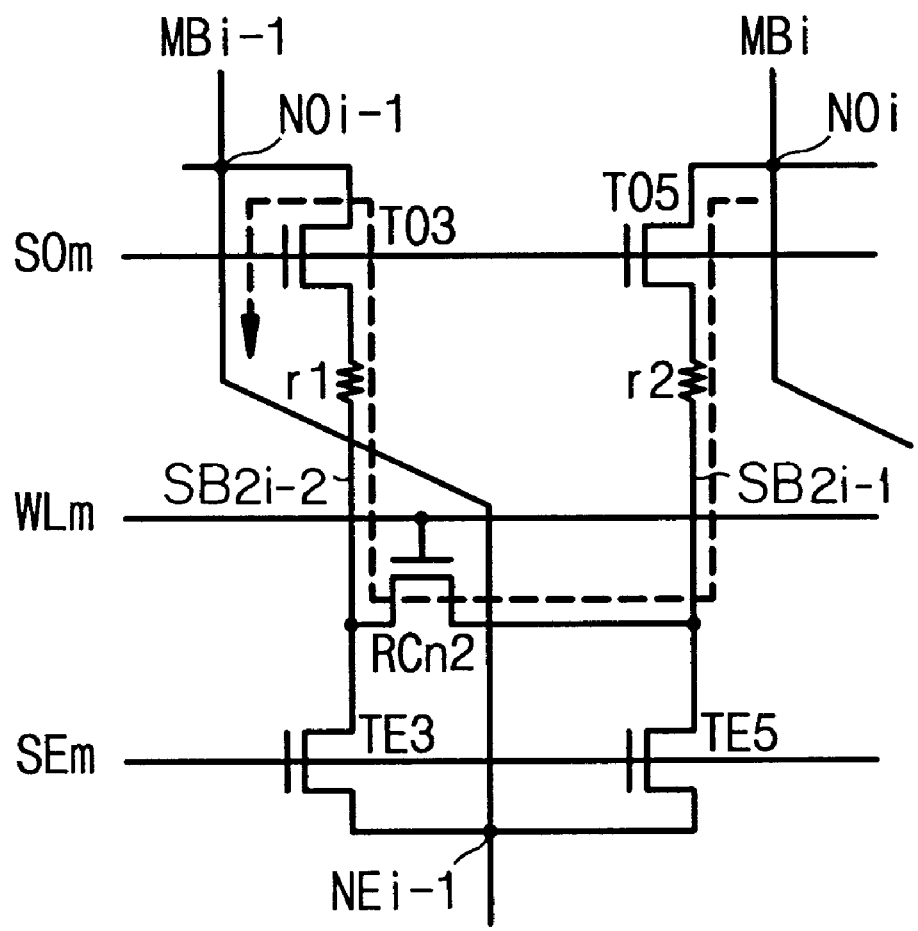
FIG. 2 is an equivalent circuit diagram depicting a current path during a read operation in FIG. 1.
Figure 3:
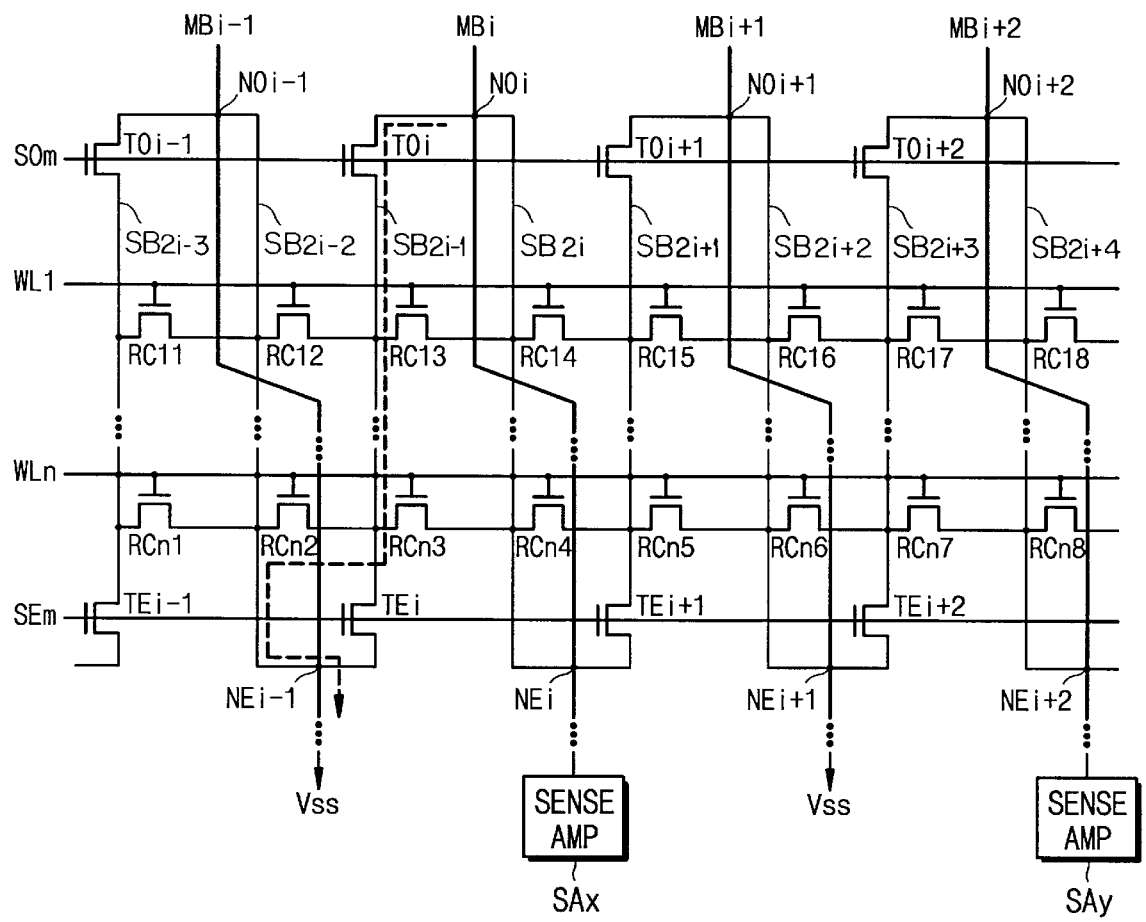
FIG. 3 is a circuit diagram illustrating another conventional architecture of a memory cell array of a nonvolatile memory.
Figure 4:
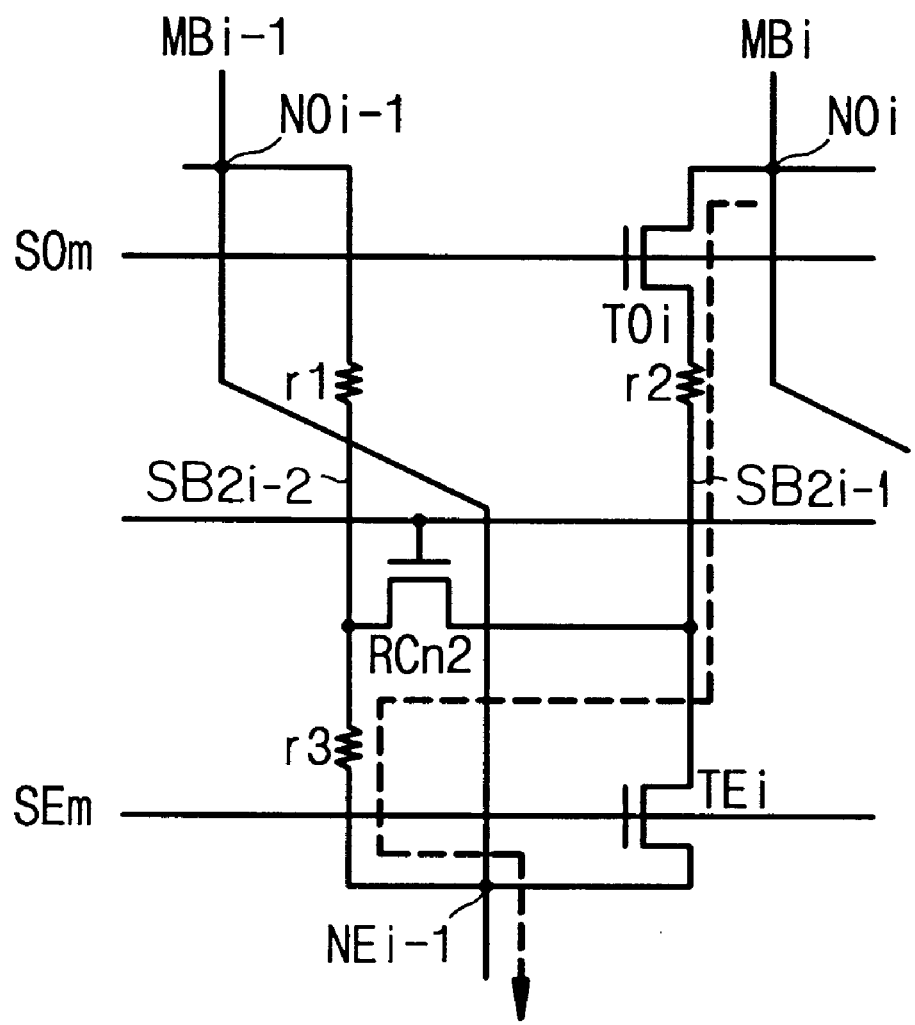
FIG. 4 is an equivalent circuit diagram depicting a current path during a read operation in FIG. 3.

Hereinbelow, applicable embodiments of the invention are described with reference to the drawings. Referring now to the drawings, the same reference numerals designate the same or corresponding parts throughout the drawings. This invention is applicable to a nonvolatile memory employing a flat-type cell array with which peripheral circuits, i.e., control signal generators, decoders, amplifiers, drivers and I/O circuits are well used in a general nonvolatile memory. The phrase "memory bank" shall be regarded to mean a group of memory cells in which each gate is connected to each word line and each channel is contacts and is interposed between adjacent bit lines.

The First Embodiment

Figure 5:
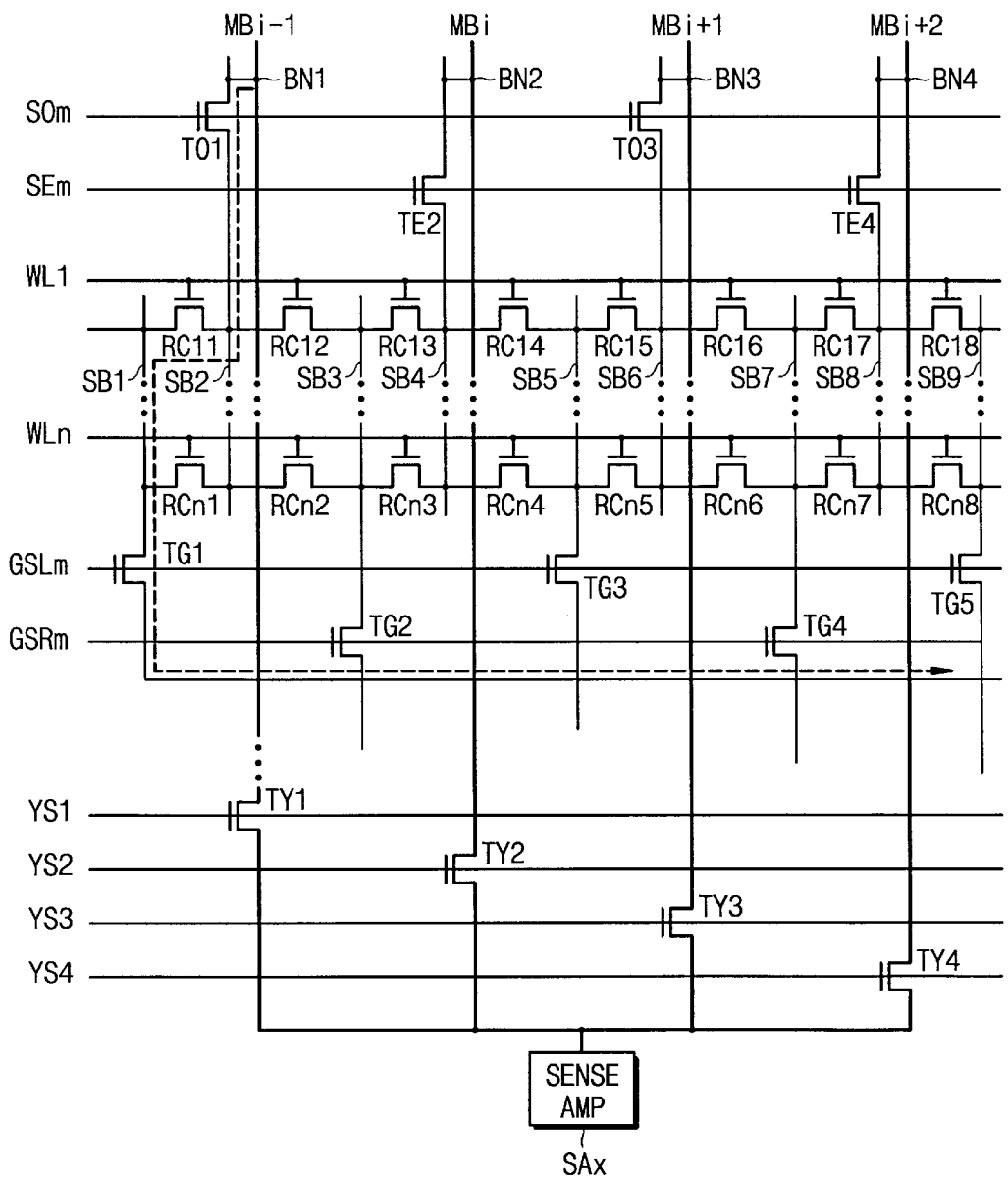
FIG. 5 is a circuit diagram illustrating an architecture of a memory cell array according to the first embodiment of the invention.

Referring to FIG. 5, main bit lines MBi−1 to MBi+2, arranged in a row direction by two memory banks, extend to the column direction and are coupled to sense amplifier SAx through column selection transistors TY1 to TY4 which are controlled by column gate signals YS1 to YS4. Each of word lines WL1 to WLn is connected to gates of memory cells RC11 to RCn1, RC12 to RCn2, . . . and RC18 to RCn8 of each memory bank. Between memory banks sub bit lines SB1 to SB9 extend in parallel with the main bit lines. The sub bit lines are coupled to sources and drains of memory cells belonging to adjacent memory banks, and they are divided into two groups: one is connected to Vss, and the other to a main bit line.

Namely, sub bit line SB1 is connected to Vss through common ground line VGL and ground selection transistor TG1, whose gate is coupled to ground selection signal GSLm. Sub bit line SB2 is connected to main bit line MBi−1 at bit line node BN1 through odd column selection transistor TO1, whose gate is coupled to odd column selection signal SOm. Sub bit line SB3 is connected to Vss through common ground line VGL and ground selection transistor TG2 whose gate is coupled to ground selection signal GSRm. Sub bit line SB4 is connected to main bit line MBi at bit line node BN2 through even column selection transistor TE2, whose gate is coupled to even column selection signal SEm. Sub bit line SB5 is connected to Vss through common ground line VGL and ground selection transistor TG3, whose gate is coupled to ground selection signal GSLm. Sub bit line SB6 is connected to main bit line MBi+1 at bit line node BN3 through odd column selection transistor TO3, whose gate is coupled to odd column selection signal SOm. Sub bit line SB7 is connected to Vss through common ground line VGL and ground selection transistor TG4, whose gate is coupled to ground selection signal GSLm. Sub bit line SB8 is connected to main bit line MBi+2 at bit line node BN4 through even column selection transistor TE4, whose gate is coupled to even column selection signal SEm. Sub bit line SB9 is connected to Vss through common ground line VGL and ground selection transistor TG5, whose gate is coupled to ground selection signal GSLm. Ground selection, transistors TG1 to TG5 are connected to common ground line VGL at nodes GN1 to GN5, respectively.

The following is a description of a read operation with reference to FIG. 5. Assuming that memory cell RC11 is selected, a voltage level of Vcc (hereinafter referred to as "high voltage" or "high") is applied to selected word line WL1 while a voltage level of Vss (hereinafter referred to as "low voltage" or "low") is applied to other unselected word lines WL2 through WLn. Odd column selection transistors TO1 and TO3 become conductive in response to odd column selection signal SOm becoming high, and even column transistors TE2 and TE4 become non-conductive by even column selection signal SEm becoming low. Otherwise, column gate selection signal YS1 goes to high in order to activate corresponding main bit line (e.g., MBi−1), making column gate transistor TY1, which connects main bit line MBi−1 to sense amplifier, SAx, to be turned on. Other column gate selection transistors TY2 to TY4 retain non-conductive states. In order to reform current discharging path from selected memory cell RC11, ground selection transistor, connecting sub bit line SB1 coupled to the source of memory cell RC11 to common ground line VGL, VGL is turned on in response to ground selection signal GSLm. Another ground selection signal GSRm retains a disable voltage level with the low voltage. Therefore, the voltage level on main bit line MBi−1 goes to high or low according to whether a data bit from selected memory cell RC11 is "1" or "0", and then sense amplifier SAx reads the current voltage level on the main bit line.

If the selected memory cell RC11 is an off-cell (VT>Vcc), the voltage level on main bit line MBi−1 rises to high and data bit "1" is read out from sense amplifier SAx. A current path cannot be formed toward adjacent main bit line MBi because adjacent ground selection transistor TG2 and even column selection transistor TE2 are turned off. Thus, current flowing into sense amplifier SAx is not induced to adjacent main bit lines MBi and MBi−2. even though other memory cells RC12 to RC18 coupled to the selected word line WL1 are all on-cells. Thus, the current from sense amplifier SAx is almost consumed in charging the selected main bit line MBi−1 and thereby the main bit line MBi−1 is satisfactorily held on the high level.

If the selected memory cell RC11 is an on-cell, the read current flows through, as shown along the broken line in FIG. 5. The read current path starts from main bit line MBi−1, odd column selection transistor TO1, sub bit line SB2, memory cell RC11, sub bit line SB1, ground selection transistor TG1 and then to common ground line VGL and Vcc. Therefore, main bit line MBi−1 is pulled down to low and then data bit "0" is read out from sense amplifier SAx. Resistance components throughout the current discharging path consists of a resistance in the source and drain diffusion regions and further capacitance on the bit lines is reduced by a half (of that in the case of FIG. 1 in which the discharging path includes two main bit lines), resulting in shortening the read-out time for data bit "0".

The Second Embodiment

Figure 6:
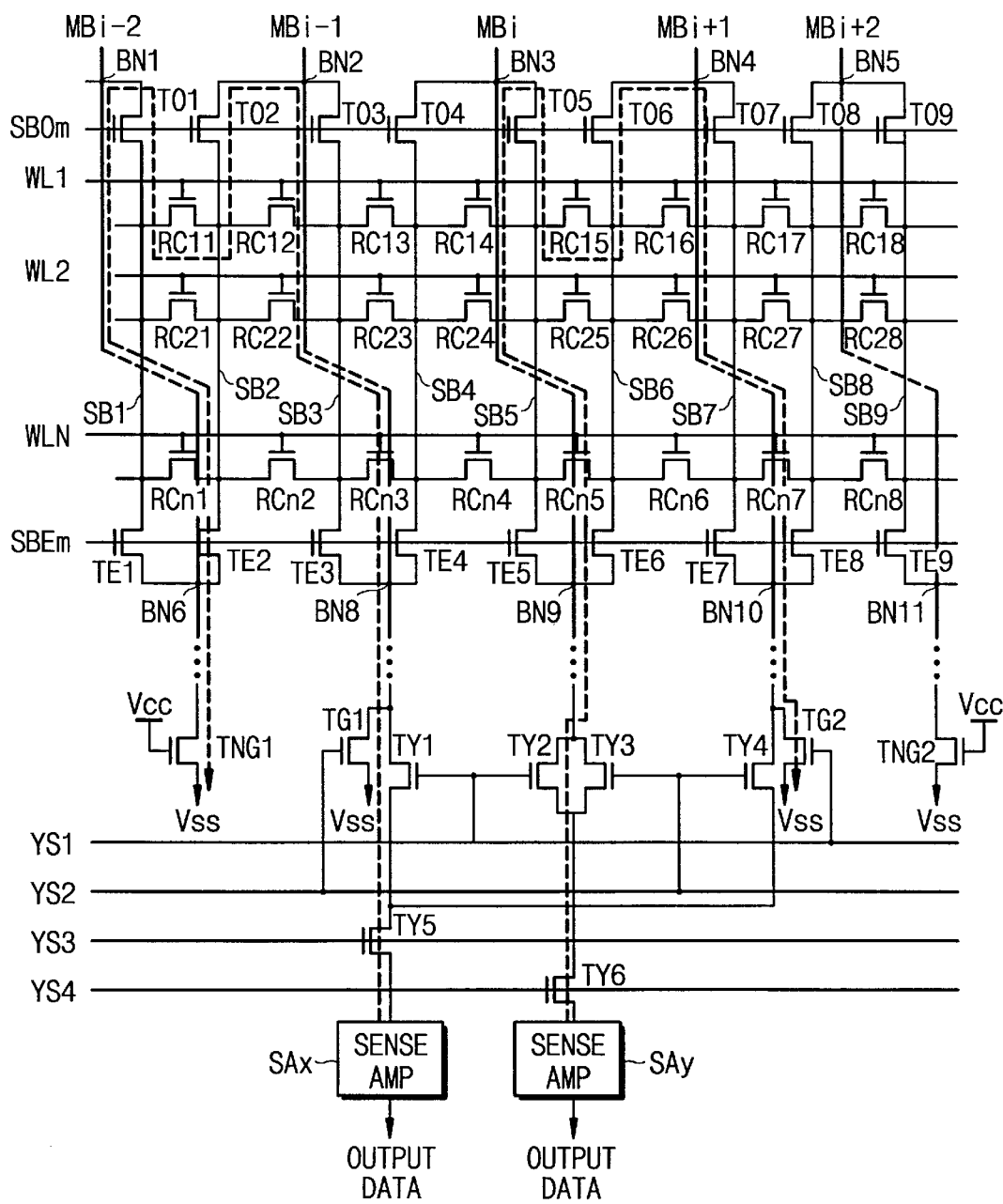
FIG. 6 is a circuit diagram illustrating an architecture of a memory cell array according to the second embodiment of the invention.

Referring to FIG. 6, main bit lines MBi−2 to MBi+2 are arranged in row direction, and they are spaced apart by two memory banks. Between memory banks, sub bit lines SB1 to SB9 are positioned in parallel with the main bit lines MBi−2 to MBi+2. Each of the main bit lines is connected to two sub bit lines through odd column selection transistors TO1 to TO9 and even column selection transistors TE1 to TE9.

Namely, sub bit line SB1 is connected to main bit line MBi−2, respectively, through odd column selection transistor TO1 and even column selection transistor TE1. Sub bit line SB2 is connected to main bit line MBi−1, respectively, through odd column selection transistor T02 and even column selection transistor TE2, and sub bit line SB3 to main bit line MBi, respectively, through odd column selection transistor T03 and even column selection transistor TE3. Sub bit line SB4 is connected to main bit line MBi−, repectively, through odd column selection transistor T04 and even column selection transistor TE4, and main bit line MBi also being connected to sub bit line SB5, respectively, through odd column selection transistor T05 and even column selection transistor TE5. Sub bit line SB6 is connected to main bit line MBi+1, respectively, through odd column selection transistor TO6 and even column selection transistor TE6, and main bit line MBi+1 also being connected to sub bit line SB7, respectively, through odd and even column selection transistor TO7 and TE7. Sub bit line SB8 is connected to main bit line MBi+2, respectively, through odd and even column selection transistor TO8 and TE8, and main bit line MBi+2 is also connected to sub bit line SB9, respectively, through odd and even column selection transistor TO9 and TE9. Gate electrodes of odd column selection transistors TO1 to TO9 are coupled to odd column selection signal SBOm in common, and gate electrodes of even column selection transistors TE1 to TE9 all receive even column selection signal SBEm. The array structure described above is repeatedly arranged over the entire memory cell array.

Main bit line MBi−2, further, is connected to Vss through ground connection transistor TNG1, whose gate is coupled to Vcc to be in a normal-conductive state. Main bit line MBi−1 is connected to Vss through ground selection transistor TG1, whose gate is coupled to column selection line YS2, and is led to sense amplifier SAx both through column selection transistor TY1, whose gate is coupled to column selection line YS1 and through column selection transistor TY5, whose gate is coupled to column selection line YSi0. Main bit line MBi is led to sense amplifier SAy both through column selection transistors TY2 and TY3 which form a parallel connection and whose gates are coupled to column selection lines YS1 and YS2, respectively, and through column selection transistor TY6, whose gate is coupled to column selection line YS2. Main bit line MBi+1 is connected to Vss through ground selection transistor TG2, whose gate is coupled to column selection line YS1, and is led to sense amplifier SAx both through column selection transistor TY4, whose gate is coupled to column selection line YS2 and through column selection transistor TY5, whose gate is coupled to column selection line YS3. Main bit line MBi+2 is connected to Vss through ground connection transistor TNG2, whose gate is coupled to Vcc so as to be in a normal-conductive state.

Main bit line MBi acts as a virtual bit line through which a voltage level responding to charges stored in the defected memory cell is transferred into sense amplifier SAy, and main bit lines MBi−2 and MBi+2 are conducted as virtual ground lines by being connected to Vss. Main bit lines MBi−1 and MBi+1 adjacent to main bit line MBi are determined to be conducted as the virtual bit lines or the virtual ground lines in accordance with the voltage levels on column selection lines YS1, YS2 and YS3. The voltage levels on the column selection lines follow coding configurations with combinations of address signals supplied from external lines, each being pulled up to high or pulled down to low. Thereafter, sense amplifier SAx uses main bit lines MBi−1 and MBi−2 as the virtual bit line and the virtual ground line, respectively, when a read operation is being conducted to memory cells RC11 through RCn1 and RC12 through RCn2, or main bit line MBi+1 acts as the virtual bit line while main bit line MBi+2 as the virtual ground line when a read operation is being conducted to memory cells RC17 through RCn7 and RC18 through RCn8. During a read operation for memory cells RC13 to RCn3 and TC14 to RCn4, or RC15 to RCn5 and RC16 to RCn6, sense amplifier SAy reads main bit line MBi into the virtual bit line and uses MBi−1 or MBi+1 for the virtual ground line.

It is well known that, as shown in table 1 which denotes alternative functions of main bit lines according to coordination of column selection lines during a read operation, two main bit lines are simultaneously selected therein and adjacent main bit lines act as ground lines. These adaptive establishments of the main bit lines provide an advantage with respect to current consumption in that leakage current, i.e., a current providing an unwanted discharging path, can be prevented from being generated through adjacent main bit lines which, being at floating condition themselves, are not used as the virtual bit lines and virtual ground lines as in FIG. 1. This will be apparent from the following the description hereinafter.

TABLE 1

|  |  | Mbi−2 | Mbi−1 | Mbi | Mbi + 1 | Mbi + 2 |
| --- | --- | --- | --- | --- | --- | --- |
| YBi0 | YAi0 | ground line | bit line | bit line | ground line | ground line |
|  | YAi1 | ground line | ground line | bit line | bit line | ground line |

In a case of that a read operation is being conducted with activated column selection signals, e.g., YS1 and YS2, memory cells RC11 and RC15 are selected when word line WL1 and odd column selection signal SB0m are enabled to be high. As column selection transistors TY1, TY2, TY5 and TY6 are turned on and ground selection transistor TG1 is turned off in response to the activated column selection signals YS1 and YS2, main bit lines MBi−1, and MBi as the virtual bit lines, are led to sense amplifiers SAx and SAy, respectively. Meanwhile, as column selection transistor TY4 is connected to main bit line MBi+1 becomes non-conductive and ground connection transistor TG2 becomes conductive, main bit line MBi+1 acts as the virtual ground line against the selected main bit line MBi. Main bit line MBi+2 fixed into Vss is used for the virtual ground line for main bit line MBi−1.

Assuming that the selected memory cells RC11 and RC15 are on-cells, current discharging paths for sense amplifiers SAx and SAy are formed, respectively. For the selected memory cell RC11, the current path starts from column selection transistor TY5, then through column selection transistor TY1, main bit line MBi−1, odd column selection transistor T02, sub bit line SB2, memory cell RC11, sub bit line SB1, odd column selection transistor T01, main bit line MBi−2, ground connection transistor TNG1 and Vss. Furthermore, for the selected cell RC15, the current path starts from column selection transistor TY6, then through column selection transistor TY2, main bit line MBi, odd column selection transistor T05, sub bit line SB5, memory cell RC15, sub bit line SB6, odd column selection transistor T06, main bit line MBi+1, ground selection transistor TG2 and Vss, in this order. Thus, voltage levels on main bit lines MBi−1 and MBi are pulled down to low and thereby data bit "0" is simultaneously read out from sense amplifier SAx and SAy.

Assuming that the selected memory cells RC11 and RC15 are off-cells, main bit lines MBi−2 and MBi+1 adjacent to main bit lines MBi−1 and MBi which act as the virtual bit lines are used for the virtual ground lines and thereby prevent the formation of unwanted current paths over the cell array of FIG. 6 as is FIG. 1.

On the other hand, also when the column selection signals YS and YAi1 are being enabled, since main bit lines MBi and MBi+1 act as the virtual bit lines and then adjacent main bit lines MBi−1 and MBi+2 act as the virtual ground lines, the read-out operation for data bit "1" can be succeeded without a delay due to the unwanted current flowing.

The Third Embodiment

Figure 7:
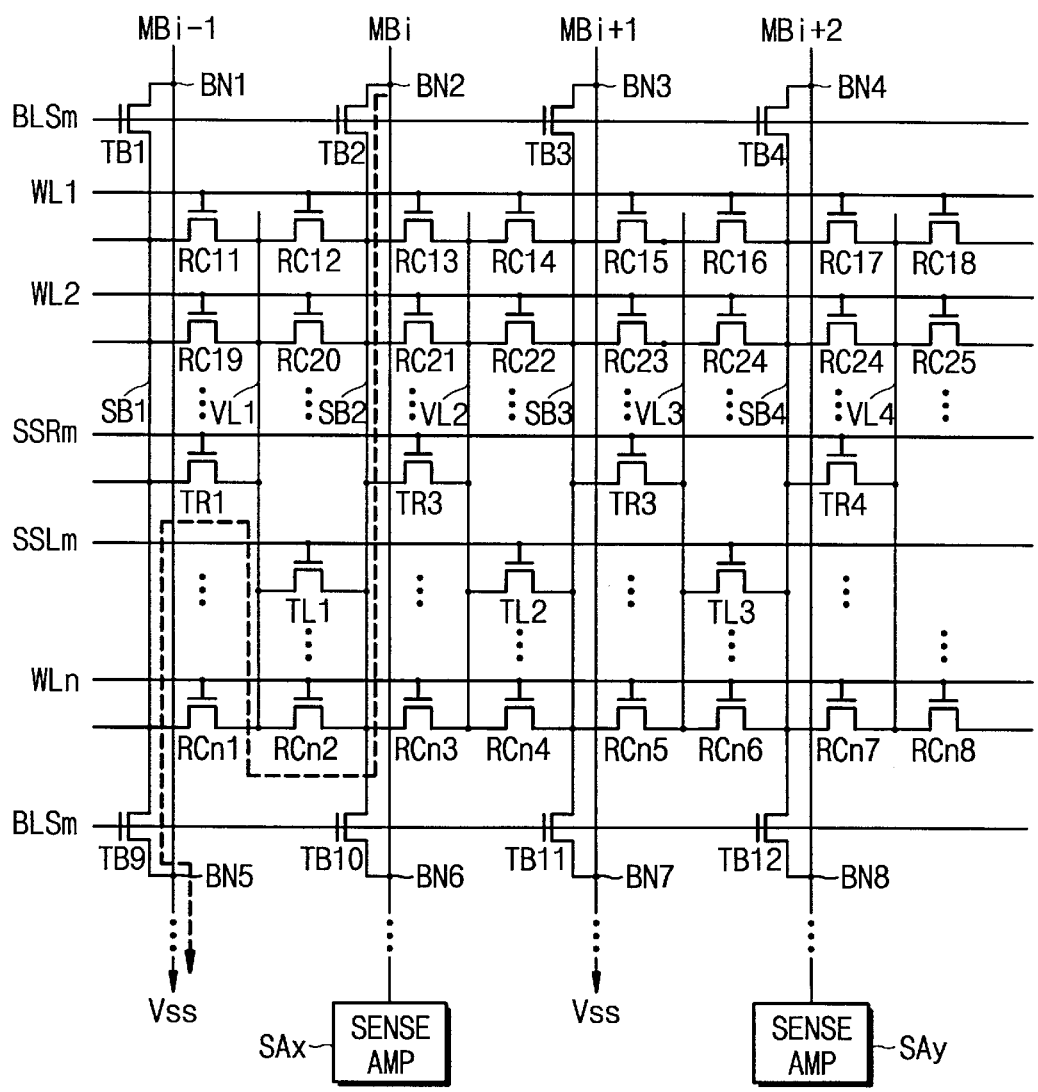
FIG. 7 is a circuit diagram illustrating an architecture of a memory cell array according to the third embodiment of the invention.

Referring now to FIG. 7, main bit lines MBi−1 to MBi+2, are arranged in row direction with a pitch of two memory banks, extend in the column direction, and are alternately connected to ground voltages and sense amplifiers. Namely, main bit lines MBi−1 and MBi+1 are connected to Vss so as to be the virtual ground lines, and main bit lines MBi and MBi+2 are led to sense amplifiers SAx and SAy, respectively, so as to be the virtual bit lines. Gate electrodes of memory cells RC11 to RCn1, RC12 to RCn2, . . . and RC18 to RCn8 are connected to word lines WL1 to WLn. Sub bit lines SB1 to SB8 extend in parallel with the main bit lines, between memory banks. Each of the sub bit lines is connected to sources and drains of memory cells belonging to adjacent memory banks and is also connected to sources and drains of bank selection transistors introduced hereinbelow.

Sub bit lines SB1 to SB8 positioned between memory banks are said to be distinguished into two groups; one group of SB1, SB3, SB5 and SB7, is to be connected to main bit lines through block selection transistors TB1 to TB12, and the other group is not, (e.g., SB2, SB4 and SB6). It should be noted that, in this embodiment, two memory banks construct one memory bank. Sub bit line SB1 is connected to main bit line MBi−1 at the upper and bottom sides of the memory array through block selection transistors TB1 and TB9. Sub bit line SB2 is connected to main bit line MBi at the upper and bottom sides of the memory array through block selection transistors TB2 and TB10. Sub bit line SB3 is connected to main bit line MBi+1 at the upper and bottom sides of the memory array through block selection transistors TB3 and TB11. Sub bit line SB4 is connected to main bit line MBi+2 at the upper and bottom sides of the memory array through block selection transistors TB4 and TB12. Gate electrodes of block selection transistors TB1 to TB12 are coupled to block selection signal BLSm in common. Furthermore, at positions along column direction in the memory bank region, bank selection transistors TR1 to TR4 and TL1 to TL3 are arranged over the center portion of the memory banks so as to select memory banks which are located left and right from a main bit line. One bank selection transistor corresponds to one memory bank and is connected to a memory cell in parallel between adjacent sub bit lines in a corresponding memory bank. Namely, bank selection transistor TR1 is interposed between sub bit lines SB1 and VL1, bank selection transistor TL1 between sub bit lines VL1 and SB2, bank selection transistor TR2 between sub bit lines SB2 and VL2, bank selection transistor TL2 between sub bit lines VL2 and SB3, bank selection transistor TR3 between sub bit lines SB3 and VL3, bank selection transistor TL3 between sub bit lines VL3 and SB4 and bank selection transistor TR4 between sub bit lines SB4 and VL4. Gate electrodes of the bank selection transistors TR1 to TR4 which belong to the memory banks positioned at the right sides of the main bit lines respectively are coupled to bank selection signal SSRm in common, while bank selection signal SSLm is applied to all gate electrodes of bank selection transistors TL1 to TL3 which belong to the memory banks positioned at the left sides of the main bit lines respectively. Note that the structure of the memory cell array of FIG. 7 is a portion of an entire memory cell array according to the present embodiment.

When memory cell RCn2 is selected, two block selection signals BLSm goes to high and word line WLn is activated with high. In order to form a current discharging path, bank selection signal SSRm is pulled up to high so as to activate bank selection transistor TR1 and bank selection signal SSLm is pulled down to low so as to cut bank selection transistor TL1.

Assuming that the selected memory cell RCn2 is an on-cell, the read current flows through main bit line MBi, block selection transistor TB2, sub bit line SB2, memory cell RCn2, sub bit line VL1, bank selection transistor TR1, sub bit line SB1, block selection transistor TB9, main bit line MBi−1 and Vss, in this order. Meanwhile, the voltage level in main bit line MBi is held on low and thereby data bit "0" is read out from sense amplifier SAx. During this read-out operation, resistance throughout the current path is only composed of components by one memory block, as is in FIG. 5, lower than that of FIG. 1 by a half. On the other hand, assuming that the selected memory cell RCn2 is an off-cell, main bit line MBi retains high and sense amplifier SAx reads data bit "1" therefrom. Similar to the prior embodiments of this invention, leakage current (or unwanted discharging current flow) among the memory banks are reduced by non-conductive bank selection transistors TL1 to TL3.

As discussed above, the invention has an advantage of reducing leakage current flowing between memory banks and reducing the degradation of read-out current, thereby resulting in high speed read operation. Furthermore, parasitic capacitances on bit lines are reduced by a decrease of the unwanted current consumption. Thus, the operational reliability of a nonvolatile memory such as a read only memory is enhanced.

Although three embodiments of the invention have been disclosed and described, it will be appreciable that other embodiments and modification of the invention are possible.

What is claimed is:

1. A semiconductor memory device comprising:
   a plurality of main bit lines including first and second groups of main bit lines;
   a plurality of sub bit lines including first, second, third and fourth groups of sub bit lines, said first and second groups of sub bit lines being capable of being connected to said first and second groups of main bit lines, respectively, and said third and fourth groups of said sub bit lines being capable of being connected to a common ground line;
   a plurality of banks each arranged between one of said first and second groups of sub bit lines and one of said third and fourth groups of sub bit lines and having a plurality of memory cells which are arranged in parallel between said one of said first and second groups of sub bit lines and said one of said third and fourth groups of sub bit lines;
   a plurality of first NMOS transistors divided into two groups, wherein one group of the first NMOS transistors is simultaneously turned on/off by a first selection signal to be connected, respectively, between said first group of sub bit lines and said first group of main bit lines, and the other group of the first NMOS transistors is simultaneously turned on/off by a second selection signal to be connected, respectively, between said second group of sub bit lines and said second group of main bit lines; and
   a plurality of second NMOS transistors divided into two groups, wherein one group of the second NMOS transistors is simultaneously turned on/off by a third selection signal so that said third group of sub bit lines can be connected to said common ground line, and the other group of the second NMOS transistors is simultaneously turned on/off by a fourth selection signal so that said fourth group of sub bit lines can be connected to the common ground line.

2. The semiconductor memory device according to claim 1, wherein the first and second selection signals are exclusively enabled so that said first group or said second group of sub bit lines are connected, respectively, to the corresponding main bit lines through the first NMOS transistors as controlled by the first or second selection signals, respectively.

3. The semiconductor memory device according to claim 2, wherein the third and fourth second selection signals are exclusively enabled so that said third and fourth group of sub bit lines are connected to the common ground line through the second NMOS transistors as controlled by the third and fourth selection signals, respectively.

4. A semiconductor memory device comprising:
   a plurality of sub bit lines and a plurality of banks each arranged between the sub bit lines and having a plurality of memory cells which are arranged in parallel between corresponding sub bit lines;
   a first main bit line;
   a second main bit line;
   a third main bit line;
   a fourth main bit line;
   means coupled to said first, second, third and fourth main bit lines and responsive to first, second, third and fourth selection signals, for connecting two adjacent ones of the four main bit lines to first and second sense-amplifiers and connecting remaining ones of the four main bit lines positioned on both sides of the two adjacent ones to ground, wherein said means comprises:
   a first NMOS transistor connected between the first main bit line and said ground and having a gate receiving an operating voltage,
   a second NMOS transistor connected between the second main bit line and said ground and having a gate receiving the second selection signal,
   a third NMOS transistor connected between the second main bit line and the first sense amplifier through a fourth NMOS transistor controlled by the third selection signal, said third NMOS transistor having a gate receiving the first selection signal,
   a fifth NMOS transistor connected between the third main bit line and the second sense amplifier through a sixth NMOS transistor controlled by the fourth selection signal, said fifth NMOS transistor having a gate receiving the first selection signal, a seventh NMOS transistor connected between the third main bit line and the sixth NMOS transistor, said seventh NMOS transistor having a gate receiving the second selection signal, and an eighth NMOS transistor connected between the fourth main bit line and the first sense amplifier through the fourth NMOS transistor, said eighth NMOS transistor having a gate receiving the second selection signal.

5. A semiconductor device comprising:

first, second, third and fourth main bit lines; first, second, third, fourth, fifth, sixth, seventh and eighth sub bit lines;

first, second, third and fourth select transistors;

first, second, third and fourth ground select transistors;

a first memory cell connected between said first sub bit line and said second sub bit line;

a second memory cell connected between said second sub bit line and said third sub bit line;

a third memory cell connected between said third sub bit line and said fourth sub bit line;

a fourth memory cell connected between said fourth sub bit line and said fifth sub bit line;

a fifth memory cell connected between said fifth sub bit line and said sixth sub bit line;

a sixth memory cell connected between said sixth sub bit line and said seventh sub bit line;

a seventh memory cell connected between said seventh sub bit line and said eighth sub bit line;

wherein said second sub bit line can be connected to said first main bit line through said first select transistor and said sixth sub bit line can be connected to said third main bit line through said third select transistor, said first and third select transistors sharing a first common select gate input;

said fourth sub bit line can be connected to said second main bit line through said second select transistor, and said eighth sub bit line can be connected to said fourth main bit line through said fourth select transistor, said second and said fourth select transistors sharing a second common select gate input;

said first sub bit line and said fifth sub bit line can be connected to a common ground line through said first and third ground select transistors, said first and third ground select transistors sharing a first common ground select gate input; and said third sub bit line and said seventh sub bit line can be connected to said common ground line through said second ground select transistor and said fourth ground select transistor, respectively, said second and said fourth ground select transistors sharing a second common ground select gate input.

* * * * *